(12) United States Patent
Tsukamoto et al.

(10) Patent No.: US 12,049,401 B2
(45) Date of Patent: Jul. 30, 2024

(54) FULLERENE STRUCTURE, METHOD OF MANUFACTURING THE SAME, AND APPARATUS FOR MANUFACTURING THE SAME

(71) Applicants: THE UNIVERSITY OF ELECTRO-COMMUNICATIONS, Tokyo (JP); NATIONAL UNIVERSITY CORPORATION YOKOHAMA NATIONAL UNIVERSITY, Yokohama (JP)

(72) Inventors: Takahiro Tsukamoto, Chofu (JP); Takahide Oya, Yokohama (JP); Taku Onishi, Yokohama (JP)

(73) Assignees: THE UNIVERSITY OF ELECTRO-COMMUNICATIONS, Tokyo (JP); NATIONAL UNIVERSITY CORPORATION YOKOHAMA NATIONAL UNIVERSITY, Yokohama (JP)

( * ) Notice: Subject to any disclaimer, the term of this patent is extended or adjusted under 35 U.S.C. 154(b) by 0 days.

(21) Appl. No.: 17/874,771

(22) Filed: Jul. 27, 2022

(65) Prior Publication Data
US 2022/0363541 A1 Nov. 17, 2022

Related U.S. Application Data

(63) Continuation of application No. PCT/JP2021/002667, filed on Jan. 26, 2021.

(30) Foreign Application Priority Data

Jan. 28, 2020 (JP) .................................. 2020-011562

(51) Int. Cl.
*C01B 32/154* (2017.01)
*C30B 29/60* (2006.01)

(52) U.S. Cl.
CPC .......... *C01B 32/154* (2017.08); *C30B 29/605* (2013.01)

(58) Field of Classification Search
CPC ...... C01B 32/152; C01B 32/158; H05B 3/145
See application file for complete search history.

(56) References Cited

U.S. PATENT DOCUMENTS

| 5,300,203 A | 4/1994 | Smalley |
| 2002/0031615 A1 | 3/2002 | Dykes et al. |
| (Continued) | | |

FOREIGN PATENT DOCUMENTS

| CN | 1441854 A | 9/2003 |
| CN | 1598046 A | 3/2005 |
| (Continued) | | |

OTHER PUBLICATIONS

Larsson, Michael P., and Stepan Lucyszyn. "Directed growth of C60 nanowhiskers for millimetre-wave detectors." Romanian J. of Inf. Sci. and Tech 8 (2005): 305-20.*

(Continued)

*Primary Examiner* — Richard M Rump
(74) *Attorney, Agent, or Firm* — Sughrue Mion, PLLC

(57) ABSTRACT

Provided is a fullerene structure including: a column-shaped part; and a fin part projecting from the column-shaped part, in which both of the column-shaped part and the fin part are fullerenes. Provided is a method of manufacturing a fullerene structure including: heating a fullerene raw material to a sublimable temperature or higher under a non-oxidizing gas; and cooling an atmosphere in which the fullerene raw material is heated. In one example, the method includes supplying the non-oxidizing gas in one direction; heating the fullerene raw material to the sublimable temperature or higher at an upstream side of a supply direction of the non-oxidizing gas; and cooling the atmosphere in which the (Continued)

fullerene raw material is heated at a downstream side of the supply direction of the non-oxidizing gas.

19 Claims, 5 Drawing Sheets

(56) References Cited

U.S. PATENT DOCUMENTS

| | | | |
|---|---|---|---|
| 2002/0192143 A1 | 12/2002 | Miyazawa et al. | |
| 2004/0057896 A1 | 3/2004 | Kronholm et al. | |
| 2021/0360745 A1* | 11/2021 | Naruse | H05B 3/145 |

FOREIGN PATENT DOCUMENTS

| | | | |
|---|---|---|---|
| CN | 101061064 A | 10/2007 | |
| JP | 2004-043245 A | 2/2004 | |
| JP | 2006-083050 A | 3/2006 | |
| JP | 2008-100874 A | 5/2008 | |
| JP | 2011-084457 A | 4/2011 | |
| JP | 2011-219282 A | 11/2011 | |
| JP | 2011-236109 A | 11/2011 | |
| JP | 2014-088305 A | 5/2014 | |
| JP | 5653667 B2 * | 1/2015 | |
| JP | 2019-149494 A | 9/2019 | |
| TW | 200502165 A | 1/2005 | |
| WO | 2007/057501 A1 | 5/2007 | |

OTHER PUBLICATIONS

Properties of materials. BBC. <https://www.bbc.co.uk/bitesize/guides/z3ntjty/revision/2#:~:text=Fullerenes%20are%20forms%20of%20carbon%2C%20and%20include%20nanotubes%20and%20buckyballs%20.&text=A%20nanotube%20resembles%20a%20layer,tension%20and%20resist%20being%20stretched.> Accessed Feb. 15, 2023.*

K. Miyazawa et al., "Structural characterization of C60 nanowhiskers formed by the liquid/liquid interfacial precipitation method", Surface and Interface Analysis, 2003, pp. 117-120, vol. 35.

International Search Report for PCT/JP2021/002667 dated Apr. 6, 2021 (PCT/ISA/210).

Office Action dated Nov. 21, 2022 in Chinese Application No. 202180011077.7.

Office Action dated Apr. 22, 2023 in CN Application No. 202180011077.7.

Office Action (Partial Supplementary European Search Report) dated Oct. 4, 2023 in European Patent Application No. 21747715.7.

M. Zhang et al., "Carbon nanotube in different shapes", Materials Today; vol. 12, No. 6, Jun. 1, 2009; pp. 12-18; XP026236969.

* cited by examiner (a) 900°C (b) 800°C (c) 700°C (d) 650°C

FULLERENE STRUCTURE, METHOD OF MANUFACTURING THE SAME, AND APPARATUS FOR MANUFACTURING THE SAME

CROSS REFERENCE TO RELATED APPLICATIONS

This application is a Continuation of PCT International Application No. PCT/JP2021/002667, filed on Jan. 26, 2021, which claims priority under 35 U.S.C 10 § 119(a) to Patent Application No, 2020-011562, filed in Japan on Jan. 28, 2020, all of which are hereby expressly incorporated by reference into the present application.

TECHNICAL FIELD

The present invention relates to a fullerene structure, a method of manufacturing the same, and an apparatus for manufacturing the same.

BACKGROUND ART

Fullerenes by themselves are small spherical molecules and exhibit various excellent properties. However, fullerenes are widely used as fullerene aggregates, complexes, or the like in industrial fields. In organic solar cells, complexes containing fullerenes are used as acceptor materials, for example. In organic transistors, fullerenes are formed on substrates in a thin film shape. In such use applications, since fullerenes as spherical molecules are in fine powders states, particulate fullerenes are used by being carried by a carrier. In order to improve the handling property of the fullerenes alone, it is desirable to form a fullerene microscale structure. It is also desirable that the crystallinity of the fullerenes is high in order to obtain excellent characteristics of the fullerenes by themselves even in a microscale structure.

There is a fullerene nano-whisker material in which fullerenes are connected in a fibrous form. The structure is formed by performing a formation method by means of a liquid-liquid interface (Non-Patent Document 1: K. Miyazawa et al., Surf. Interface Anal, 35, 117 (2003).). Therefore, the formation rate is very slow and this is a bottleneck for the material to be applied in industrial fields.

Patent Document 1 discloses a method of manufacturing a hollow hexagonal columnar fullerene fine structure by mixing an isopropyl alcohol solution containing a metal peroxide and a toluene solution containing fullerenes under a low temperature condition.

In the method disclosed in Patent Document 1, a reaction is performed with solutions at a low temperature and therefore a time of 10 hours or longer is required.

Patent Document 2 discloses a method of preparing a fullerene nano-whisker/nanofiber nanotube carrying a metal catalyst by holding an isopropyl alcohol solution containing a platinum catalyst and/or a ruthenium catalyst and a toluene solution containing fullerenes at −10 to 30° C. while forming a liquid phase interface.

In the method disclosed in Patent Document 2, a time period of 0.5 to 20 days is required because a reaction is performed by means of the liquid phase interface at a low temperature.

Patent Document 3 discloses a method of manufacturing a fullerene nano-whisker by forming two or more interfaces with a saturated solution of carbon fullerenes and a second solvent and precipitating fullerene nano-whisker aggregates at each interface.

In the method disclosed in Patent Document 3, attempts are made to shorten the formation time of the fullerene nano-whisker and enhance structural control for uniformity and length. However, the growth rate of the fullerene nano-whisker is about 1 μm/min.

Patent Document 4 discloses a carbon structure in which silver ion particles are formed on the surface of a fine wire composed of fullerene molecules and the fine wire has a hexahedral shape. Further, Patent Document 4 discloses that the carbon structure is manufactured by incubating a silver ion solution of 1-butanol adding the silver ion solution to a fullerene solution, forming a liquid-liquid interface between the fullerene solution and the silver ion solution, and precipitating a fullerene structure.

In examples of Patent Document 4, 8 to 20 days are required for the incubation of the silver ion solution and 20 to 40 hours are required for the precipitation of the fullerene structure.

Patent Document 5 discloses a method of manufacturing: a two-component fullerene nano-whisker having a desired length and diameter by pouring a poor solvent into a mixed solution containing C60 powder and C70 powder, forming a liquid-liquid interface, and leaving a solution in which a crystal nucleus is formed at 15° C. for two days.

PRIOR ART DOCUMENTS

Patent Documents

Patent Document 1: JP 2004-043245 A
Patent Document 2: JP 2006-083050 A
Patent Document 3: JP 2008-100874 A
Patent Document 4: JP 2011-219282 A
Patent Document 5: JP 2014-088305 A Non-Patent Document Non-Patent Document 1: K. Miyazawa et al, Surf. Interface Anal, 35, 117 (2003)

SUMMARY OF THE INVENTION

Problems to be Solved by the Invention

In all of the methods of manufacturing fullerene structures disclosed in Patent Documents 1 to 5, liquid-liquid interfaces are used and formation rates of fullerene structures tend to be slow.

In the method using the liquid-liquid interface disclosed in Patent Document 3, an attempt is made to shorten the formation time, but time is still required for the formation, and there is a problem that mass production is difficult.

Patent Document 4 and Patent Document 5 attempt to provide a fullerene structure having functionality, but the formation time has not been shortened sufficiently.

One object of the present invention is to provide a fullerene structure having high crystallinity. Another object of the present invention is to provide a fullerene structure in a short time easily.

Means to Solve the Problems

The present invention is characterized as follows.

[1] A fullerene structure including: a column-shaped part; and a fin part projecting horn the column-shaped part, in which both of the column-shaped part and the fin part are fullerenes.

[2] The fullerene structure according to [1], in which the fin part is formed on at least one side surface of the column-shaped part.

[3] The fullerene structure according to [1] or [2], which both of the column-shaped part and the fin part are crystalline fullerenes.

[4] A method of manufacturing a fullerene structure including: heating a fullerene raw material to a sublimable temperature or higher under a non-oxidizing gas; and cooling an atmosphere in which the fullerene raw material is heated.

[5] The method of manufacturing a fullerene structure according to [4], further including: supplying the non-oxidizing gas in one direction; heating the fullerene raw material to the sublimable temperature or higher at an upstream side of a supply direction of the non-oxidizing gas; and cooling the atmosphere in which the fullerene raw material is heated at a downstream side of the supply direction of the non-oxidizing gas.

[6] An apparatus for manufacturing a fullerene structure including: a reaction vessel including a first section and a second section; a raw material charging part disposed in the first section; a product collection part disposed in the second section; a heater that heats the first section in the reaction vessel; temperature control means for controlling a temperature of the second section in the reaction vessel to be lower than a temperature of the first section; and a gas supplier for supplying a non-oxidizing gas into the reaction vessel.

[7] The apparatus for manufacturing a fullerene structure according to [6], in which the reaction vessel is a reaction tube, the gas supplier supplies the non-oxidizing gas into the reaction tube from one end side of the reaction tube in an axial direction, the first section is disposed on at upstream side of a supply direction of the non-oxidizing gas, and the second section is disposed at a downstream side of the supply direction of the non-oxidizing gas.

[8] The apparatus for manufacturing a fullerene structure according to [6] or [7], in which the heater heats the first section from an outer peripheral side of the reaction vessel.

[9] The apparatus for manufacturing a fullerene structure according to [6] or [7], in which the heater is disposed inside the reaction vessel.

[10] The apparatus for manufacturing a fullerene structure according to any one of [6] to [9], further including: a gas discharge device for discharging a gas from the reaction vessel.

[11] The apparatus for manufacturing a fullerene structure according to any one of [6] to [10], further including: a cooler for cooling the second section in the reaction vessel.

[12] The apparatus for manufacturing a fullerene structure according to any one of [6] to [11], farther including: a controller for controlling the heater and the gas supplier, in which the controller controls the heater such that the first section is at or above a sublimable temperature of a raw material and controls the gas supplier to supply the non-oxidizing gas such that the second section is at a temperature lower than a temperature of the first section.

Effects of the Invention

According to the present invention, it is possible to provide a fullerene structure having high crystallinity. Further, according to the present invention, a fullerene structure can be easily provided in a short time.

EMBODIMENTS FOR CARRYING OUT THE INVENTION

Figure 1:
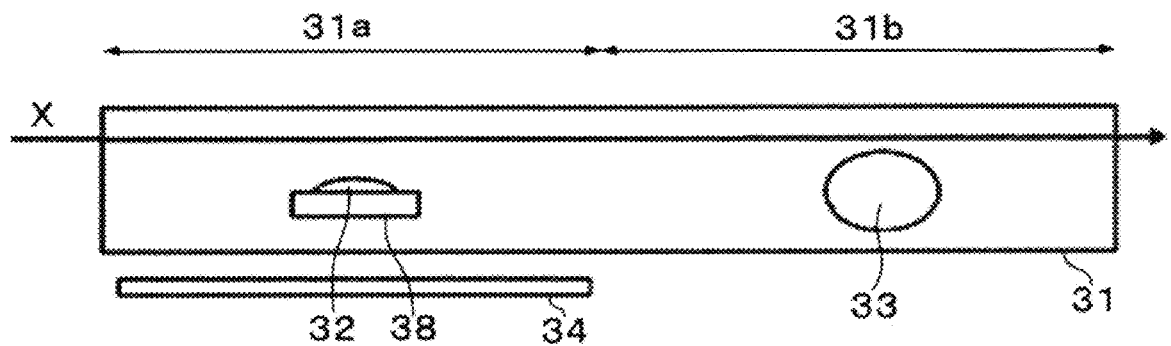
FIG. 1 is a schematic explanatory diagram for explaining one example of a method of manufacturing a fullerene structure.

Although one embodiment of the present invention will be described below, the examples in the following embodiment do not limit the present invention.

(Fullerene Structure)

A fullerene structure according to the embodiment includes a column-shaped part and a fin part projecting from the column-shaped part. Both of the column-shaped part and the fin part are fullerenes.

This can provide a fullerene structure having high crystallinity.

The column-shaped part and the fin part of the fullerene structure according to the embodiment are fullerenes. Therefore, it is possible to exhibit functions without carrying fullerenes on other materials. The fullerene structure can include a microscale or even millimeter-scale structure. A microscale fullerene structure is superior also in terms of handling. Nanoscale fine powders tend to be difficult to handle.

Further, the fullerene structure according to the embodiment has high crystallinity and is densely filled with fullerenes, and therefore the fullerene structure can be superior in terms of conductivity or the like. Further, fullerenes are promising as an n-type conductive material, and by using the fullerene structure according to the embodiment, a wide range of use applications can be expected. Further, the fullerene structure according to the embodiment has a structure in which the column-shaped part extends in one direction, and thus application to electrical wiring or the like can be expected. The fullerene structure according to the embodiment has the advantage that it is easy to make electrical contact. Both of the column-shaped part and the fin part of the fullerene structure according to the embodiment are preferably crystalline fullerenes. When the column-shaped part and the fin part are crystalline fullerenes, these advantages can be exhibited to a greater extent with their high crystallinity.

The fullerene structure according to the embodiment can be formed by means of vapor phase growth as described later, and therefore the structure can be grown to a microscale or even millimeter-scale structure in a short time. Meanwhile, a conventional fullerene nano-whisker material is formed by using the liquid-liquid interface, and in the formation method using the liquid-liquid interface, the formation rate is very slow. The method of manufacturing the fullerene structure according to the embodiment can achieve a formation rate which is at least 100 times faster than that of the conventional method.

The fullerene structure according to one embodiment preferably has a shape including a column-shaped part and a fin part projecting from the column-shaped part. Further, the fullerene structure preferably has a shape including a column-shaped part and a fin part projecting from at least one side surface of the column-shaped part.

The columnar shape of the fullerene structure has a short diameter and a long diameter and the general outer shape may be a cylindrical shape, an elliptical column shape, a polygonal column shape, or the like. Examples of the polygonal column shape may include a triangular pillar shape, a square pillar shape, a pentagonal pillar shape, a hexagonal pillar shape, or the like. It is sufficient if the general outer shape is a columnar shape, and the columnar shape may have a shape in which grooves, protrusions, and the like are formed along the long axis direction of the columnar shape. The columnar shape is preferably a solid shape.

Cross sectional shapes of the columnar shape in the direction perpendicular to the long axis over the entire length of the long axis may be substantially the same or different. The columnar shape may have a large cross sectional shape at one end and a narrow and tapered cross sectional shape at the other end, for example.

In the columnar shape, the crystal may grow in one direction of the long axis direction from the crystal nucleus after the crystal nucleus is formed. In this state, often one end of the columnar shape is thick and the other end is narrow and tapered.

The fin part is formed to project from the columnar shape. The fin part is formed integrally with the column-shaped part. Therefore, the shape can be maintained even if a certain degree of mixing processing, dispersion processing, or the like is performed.

It is considered that the fin part is formed in order to ensure a shape in which the crystal is stabilized by increasing the crystallinity of the fullerene structure. Further, it is considered that the planar region of the fin part becomes large if the stable surface of the crystal becomes dominant.

Although the shape of the fin part is not particularly limited, it is preferable that the fin part has a shape projecting from the side surface of the column-shaped part and has at least one planar region. More preferably, the fin part preferably projects from the side surface of the column shape by a length of 0.5 times or more, and more preferably 0.8 times or more, of the short diameter of the cross section of the column-shaped part of the portion from which the fin part projects.

Although the shape of the fin part is not particularly limited, it is preferable that the length (a) in the direction parallel to the long axis direction of the column-shaped part is longer than the maximum length (b) in the direction perpendicular to the long axis direction of the column-shaped part. It is more preferable that a/b is 1.1 and "a" is 1.1 times or more longer than "b", and it is still more preferable that a/b is 1.2 and "a" is 1.2 times or more longer than "b", for example.

Figure 5:
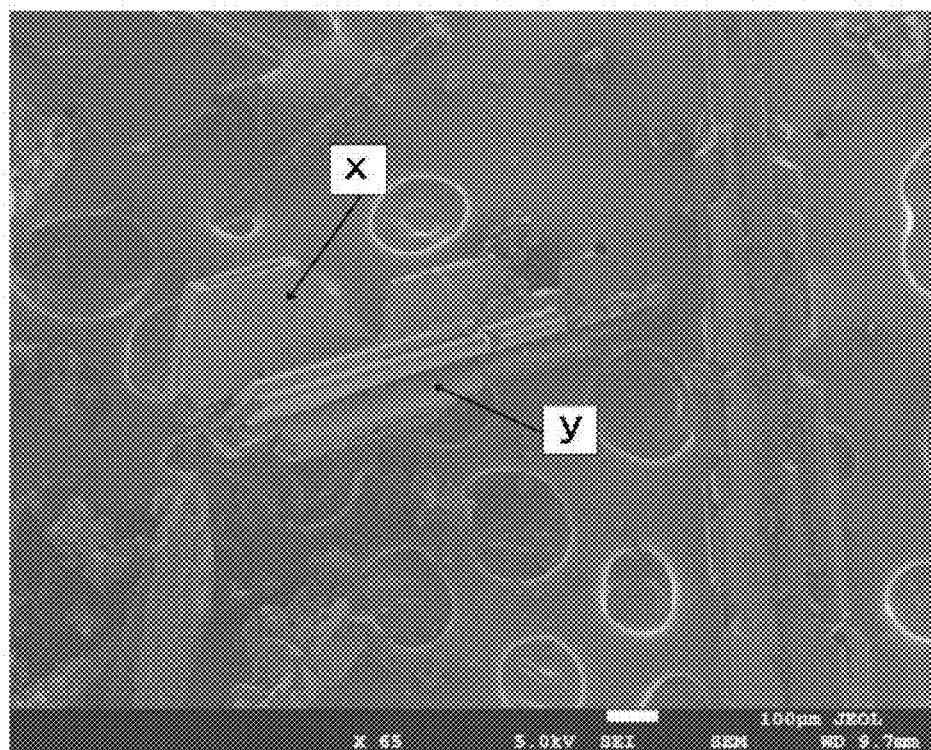
FIG. 5 is a photograph of the fullerene structure obtained in Example 1 by means of a scanning electron microscope (SEM).

Although the shape of the fin part is not particularly limited, fin parts may be formed over the entire length of the long diameter of the column-shaped part, or may be formed aver a partial length. The letter (c) denotes the long diameter of the column-shaped part and (a) denotes the length of a single fin part, and a/c is preferably 0.1 to 0.8, a/c is preferably 0.2 to 0.5, and a/c is more preferably 0.2 to 0.4, FIG. 5 shows one embodiment of a fullerene structure. In FIG. 5, x shows a column-shaped part and y shows a fin part.

In one fullerene structure, one or more fin parts may be formed on a column-shaped part. In this case, one or more fin parts may be formed on one side surface of the column-shaped part, or one or more fin parts may be formed on each of two or more side surfaces of the column-shaped part.

Although the size of the fullerene structure is not particularly limited, the short diameter is preferably 1 μm or more, the short diameter may be 10 μm or more, and the short diameter may be 50 μm or more. Although the aspect ratio of the short diameter to the long diameter is not particularly limited, the aspect ratio is preferably 1:1.1 or more, more preferably 1:1.5 or more, and may be 1:2 or more.

Both of the short diameter and the long diameter of the fullerene structure are numerical values obtained from the size of the overall appearance shape including the column-shaped part and the fin part.

The fullerene structure may be various fullerenes such as C60, C70, C76, and C80, for example. The fullerene structure may be a fullerene derived from a fullerene raw material such as a fullerene derivative, a functional fullerene modified with an organic molecule, or the like. One of them may be used alone or a combination of two or more of them may be used.

The fullerene structure preferably exhibits crystallinity as a whole. Specifically, both of the column-shaped part and the fin part are preferably crystalline fullerenes. The fullerene structure is preferably a face-centered cubic lattice.

(Method of Manufacturing Fullerene Structure)

One example of a method of manufacturing a fullerene structure according to the embodiment will be described below. The fullerene structure according to the embodiment is not limited to those manufactured by means of the following manufacturing method.

The method of manufacturing the fullerene structure according to the embodiment includes heating a fullerene raw material to a sublimable temperature or higher under a non-oxidizing gas and cooling the atmosphere in which the fullerene raw material is heated.

This method can easily provide a fullerene structure in a short time. Further, this method can provide a fullerene structure having high crystallinity.

According to this manufacturing method, the fullerene structure can be provided by means of a relatively simple method for a heat treatment. Further, according to this manufacturing method, the fullerene structure can be provided without using a liquid phase, a catalyst, or the like and a fullerene structure of high purity can be provided.

In the step of heating the fullerene raw material, the heating temperature is preferably equal to or higher than the sublimable temperature of the fullerene.

The sublimable temperature means the temperature at which the fullerene at least partially starts sublimation.

Specifically, the heating temperature is preferably 700° C. or higher, more preferably 800° C. or higher, and still more preferably 900° C. or higher. By heating the fullerene at the temperature of 700° C. or higher, the fullerene partially starts sublimation. More fullerenes can sublimate if the fullerene is heated at the temperature of 800° C. or higher although it depends on the reaction conditions such as the size and shape of the reaction vessel and the heating time.

It is sufficient if the heating temperature is a temperature at which the fullerene is partially sublimated. By heating the fullerene to the sublimation temperature or higher of the fullerene, the time for sublimation of the fullerene can be shortened and the reaction can be efficiently performed, From this viewpoint, the heating temperature is preferably 1200° C. or less, more preferably 1000 CC or lower, and still more preferably 950° C. or lower.

The heating temperature is preferably 700 to 1200° C., more preferably 800 to 1000° C., and more preferably 900 to 950° C., for example.

In the step of heating the fullerene raw material, the atmosphere is preferably a non-oxidizing atmosphere and more preferably an inert atmosphere. This can prevent the occurrence of a by-product caused by the oxidation reaction.

Examples of the non-oxidizing gas include an inert gas such as argon gas, a nitrogen gas, or a helium gas and the non-oxidizing gas may be a mixture of these gases. The inside of the reaction vessel may be a vacuum atmosphere.

In the step of heating the fullerene raw material, the gas inside the reaction vessel s preferably a non-oxidizing gas in a temperature range which is equal to or higher than the sublimable temperature. In order to enhance the cleanliness inside the reaction vessel, the gas inside the reaction vessel may be replaced with a non-oxidizing gas before starting the heating of the fullerene raw material, for example.

In the step of heating the fullerene raw material, a non-oxidizing gas may be filled in the reaction vessel. After a non-oxidizing gas is filled in a reaction vessel, the material is heated, and the heated atmosphere is carried to a non-heating region due to the convection of an air flow to cool the heated atmosphere, for example. Accordingly, a fullerene structure can be precipitated. Further, as will be described in detail later, the non-oxidizing gas may be continuously supplied into the reaction vessel so as to generate a one-way air flow in a reaction tube and carry the heated atmosphere to the non-heating region.

In the step of cooling the atmosphere in which the fullerene raw material has been heated, the gas in the reaction vessel is preferably a non-oxidizing gas in a temperature range which is equal to or higher than the sublimable temperature. In the cooling step, the gas in the reaction vessel is more preferably a non-oxidizing gas in a temperature range which is equal to or higher than 300° C., for example. The gas in the reaction vessel may be a non-oxidizing gas during cooling of the temperature to a room temperature.

In the step of heating the fullerene raw material, the heating time is appropriately adjusted depending on reaction conditions such as the mass of the raw material to be charged, the size of the reaction vessel, and the heating temperature. The heating time is the time from when the temperature reaches a predetermined heating temperature to when the material is cooled down to less than the temperature.

The heating time is preferably 10 minutes or more, more preferably 30 minutes or more, and still more preferably 1 hour or more, for example. This can further promote the sublimation of the fullerene raw material and can precipitate a fullerene structure.

The heating time is preferably 10 hours or less, more preferably 5 hours or less, and may be 2 hours or less. In a method according to one embodiment, precipitation of a fullerene structure is possible even in a heat treatment performed for a short time. Therefore, the reaction can be performed in a shorter time in the above range.

The size of the obtained fullerene structure tends to increase due to a high heating temperature, a long heating time, and the like. Therefore, the heating temperature and the heating time may be appropriately adjusted depending on the size desired. If the heating time becomes long, the length of the fullerene structure to be precipitated tends to increase in the long axis direction. Therefore, in order to obtain a structure which is long in the long axis direction, it is preferable to increase the heating time.

In the step of heating the fullerene raw material, the temperature increase rate depends on the heating method, the size of the reaction vessel, and the like, but is preferably 10 to 100° C. min and more preferably 20 to 30° C./min, for example.

In the step of heating the fullerene raw material, the pressure is not particularly limited and the reaction can be performed under atmospheric pressure.

In the step of heating the fullerene raw material, the input amount of the fullerene raw material can be appropriately set according to the manufacturing conditions such as the size of the reaction vessel. The fullerene raw material may be batch-processed or continuously administered.

The step of cooling the atmosphere in which the fullerene raw material is heated is performed to cool the atmosphere including the sublimated fullerene raw material after the step of heating the fullerene raw material. Accordingly, the nucleus of the fullerene crystal is precipitated from the atmosphere including the sublimated fullerene raw material, and the crystalline fullerene is deposited in the reaction vessel, for example, on the bottom surface of the reaction vessel. The deposited fullerene is maintained at a certain high temperature. Therefore, it is considered that an active state is maintained and the crystal growth proceeds slowly. Finally, a fullerene structure having a columnar shape with fin parts can be formed.

In the step of cooling the atmosphere in which the fullerene raw material is heated, the atmosphere is preferably cooled to a temperature which is lower than the sublimable temperature of the fullerene, and more preferably to a temperature or lower, at which the nucleus of the fullerene crystal starts to precipitate.

The cooling may be performed by natural cooling in air, may be performed by forced cooling by using a cooler, or may be performed at a slow cooling rate.

The fullerene raw material is not particularly limited and may be various fullerenes. Examples of the fullerene include C60, C70, C76, C80, and the like.

A fullerene derivative, a functional fullerene modified with an organic molecule, or the like may be used as the fullerene raw material.

The fullerene raw material may be any of a powder, granules, a lump, and the like.

The fullerene raw material may be used alone or in combination of two or more kinds.

A preferable example of manufacturing the fullerene structure includes: supplying a non-oxidizing gas in one direction; heating the fullerene raw material to the sublimable temperature or higher at the upstream side of the supply direction of the non-oxidizing gas; and cooling the atmosphere in which the fullerene raw material is heated at the downstream side of the supply direction of the non-oxidizing gas.

In this method, heating of the fullerene raw material and cooling can be more easily performed.

By supplying the non-oxidizing gas in one direction, an air flow in one direction is generated in a reaction system. When the fullerene raw material is heated to the sublimable temperature or higher at the upstream side of the supply direction of the non-oxidizing gas, the fullerene raw material is heated at the upstream side and the atmosphere including the fullerene raw material can be formed. The atmosphere is carried to the downstream side of the supply direction of the non-oxidizing gas along the air flow in one direction. The atmosphere including the fullerene raw material is exposed to a lower temperature region during the process in which the atmosphere is carried to the non-heating region at the downstream side. By cooling the atmosphere including the fullerene raw material in this way, the nucleus of the fullerene crystal is formed, and accordingly the fullerene structure is precipitated. At this time, the fullerene structure is precipitated and deposited at a place where a suitable cooling temperature is attained at the downstream side of the air flow in one direction.

In such a reaction system, by controlling the heating temperature of the fullerene raw material, the supply rate of the non-oxidizing gas, and the like, the temperature gradient of the entire reaction system can be made constant. This can substantially fix the position at which the fullerene structure is precipitated and deposited.

The supply rate of the non-oxidizing gas is preferably 0.1 to 2 μmin and more preferably 0.2 to 1 L/min.

The non-oxidizing gas may be released into the atmosphere by using a gas discharge pipe or may be forcibly discharged by using a fan or the like.

FIG. 1 is a diagram for schematically explaining the method. FIG. 1 is a diagram schematically showing a cross section of a reaction tube. Reference numeral 31 denotes a reaction tube, reference numeral 32 denotes a raw material charging part, reference numeral 33 denotes a product collection part, reference numeral 34 denotes a heater, and reference numeral 38 denotes a sample table on which a fullerene raw material is placed. The supply direction of the non-oxidizing gas is indicated by X.

A fullerene raw material is placed on the raw material charging part 32 positioned on the sample table 38 in the reaction tube 31 and a heating region 31*a* is heated from the outside of the reaction tube 1 by means of the heater 34. Accordingly, the fullerene raw material is heated to a sublimable temperature or higher and sublimated. The atmosphere including the fullerene raw material is carried to a non-heating region 31*b* at the downstream side in the supply direction X by means of the air flow of the non-oxidizing gas. A fullerene crystal nucleus is formed in the product collection part 33 at the downstream side in the supply direction X and a fullerene structure can be precipitated.

(Apparatus for Manufacturing Fullerene Structure)

One example of an apparatus for manufacturing a fullerene structure according to the embodiment will be described below. The fullerene structure according to the embodiment is not limited to those manufactured by means of the following manufacturing apparatus. The method of manufacturing the fullerene structure according to the embodiment is not limited to a method using the following manufacturing apparatus.

An apparatus for manufacturing a fullerene structure according to the embodiment includes: a reaction vessel having a first section and a second section; a raw material charging part disposed in the first section; a product collection part disposed in the second section; a heater for heating the first section in the reaction vessel; temperature control means for controlling the temperature in the second section in the reaction vessel to be lower that the temperature in the first section; and a gas supplier for supplying a non-oxidizing gas to the reaction vessel.

This can provide a fullerene structure easily in a short time. Further, according to this method, it is possible to provide a fullerene structure having high crystallinity.

According to this manufacturing apparatus, a fullerene structure can be provided by means of the relatively simple method of a heat treatment. Further, according to the manufacturing apparatus, the fullerene structure can be provided without using a liquid phase or a catalyst and a fullerene structure of high purity can be provided.

As a preferred example of an apparatus for manufacturing a fullerene structure according to the embodiment, the reaction vessel is a reaction tube, a gas supplier supplies a non-oxidizing gas into the reaction tube from one end side of the reaction tube in the axial direction, a first section is arranged at the upstream side of the supply direction of the non-oxidizing gas, and a second section is arranged at the downstream side of the supply direction of the non-oxidizing gas.

In this apparatus, the temperature control means can control the temperature in the second section in the reaction vessel to be lower than the temperature in the first section by controlling the air flow of the non-oxidizing gas and the heating by the heater.

The method of controlling the temperature in the second section in the reaction vessel to be lower than the temperature in the first section is not limited to this. A temperature gradient may be generated in the reaction vessel by using the convection of an air flow by heating one part in the reaction vessel.

Figure 2:
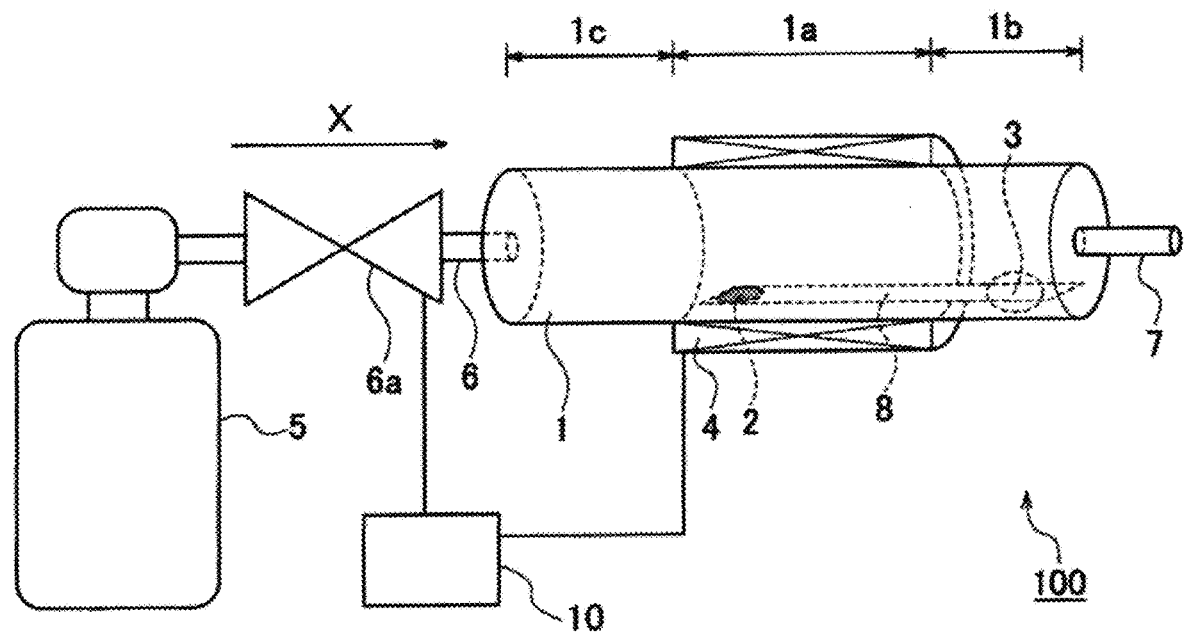
FIG. 2 is a schematic perspective view for explaining one example of an apparatus for manufacturing a fullerene structure.

FIG. 2 shows one example of an apparatus for manufacturing a fullerene structure according to one embodiment.

In an apparatus 100 for manufacturing a fullerene structure shown in FIG. 2, reference numeral 1 denotes a reaction tube, reference numeral 2 denotes a raw material charging part, reference numeral 3 denotes a product collection part, reference numeral 4 denotes a heater, reference numeral 5 denotes a gas supplier, reference numeral 6 denotes a gas supply pipe, reference numeral 7 denotes a gas discharge pipe, and reference numeral 8 denotes a sample table. The heater 4 and a gas control valve 6*a* of the gas supply pipe 6 are connected to a controller 10 so as to be controllable. In the drawing, X indicates the gas supply direction.

As another example of the manufacturing apparatus, a controller for controlling the heater 4 and a controller for controlling the gas control valve 6*a* of the gas supply pipe 6 may be provided separately.

The reaction tube 1 is divided into a non-heating region 1*c*, a heating region 1*a* as a first section, and a non-heating region 1*b* as a second section in this order from the upstream side of the gas supply direction X.

The reaction tube 1 is preferably made of a material which is durable against heating temperatures and with which impurities are not mixed into the tube at high temperatures. Examples of the material include quartz glass, ceramic, or the like.

The reaction tube 1 preferably has a cylindrical shape from the viewpoint that the pressure load in the reaction tube becomes uniform and damage to the reaction tube is prevented.

The heater 4 is a coil heater and is wound around the outer peripheral surface of the reaction tube 1 in the heating region 1*a*. The coil heater as the heater 4 is connected to a power source (not shown), generates heat when a current flows, and the temperature can be controlled by the amount of current. This temperature control can be performed by the controller 10.

The heater 4 is not limited to a coil heater, and various heaters such as a panel heater and a radiant heater can be used. A heater may be provided in the reaction vessel depending on the type and size of the reaction vessel.

The sample table 8 can be disposed inside the reaction tube 1. A fullerene raw material can be placed on the sample table 8 and charged. Further, the fullerene structure after the reaction can be deposited on the sample table 8 and collected. The sample table 8 is installed in the reaction tube 1 so as to be adjustable in height.

The sample table 8 is preferably made of a material having heat resistance and low reactivity even at high temperatures. Examples of the material preferably include a quartz substrate, a silicon (Si) substrate, or the like.

Although the sample table 8 may not be used, the reaction can be performed continuously and smoothly by using the sample table 8 in consideration of cleaning the inside of the reaction tube 1.

The gas supplier 5 is filled with a non-oxidizing gas and can supply the non-oxidizing gas to the reaction tube 1 through the gas supply pipe 6. The gas supplier 5 is connected to one end side of the reaction tube 1 and can supply the non-oxidizing gas from the one end side of the reaction tube 1. The gas control valve 6a is interposed between the gas supplier 5 and the reaction tube 1 and the supply amount of the non-oxidizing gas can be controlled by means of the controller 10.

The gas discharge pipe 7 as a gas discharge device is connected to the other end side of the reaction tube 1 and a gas can be discharged from the other end side of the reaction tube 1. The discharged gas may be discharged by means of atmospheric release. The gas may be forcibly discharged by using a fan or the like. The discharged gas may be treated by means of an exhaust gas treatment device (not shown).

The raw material charging part 2 is disposed in the heating region 1a in the reaction tube 1. A fullerene raw material may be charged and placed in the region where the coil heater as the heater 4 is wound.

The product collection part 3 is arranged in the non-heating region 1b in the reaction tube 1. The position of the product collection part 3 becomes a region where the coil of the heater 4 is not wound. More specifically, the product collection part 3 is positioned such that the atmosphere including the fullerene raw material which is heated and sublimated in the heating region 1a is carried to the downstream side in the gas supply direction X and cooled to an appropriate temperature in the non-heating region 1b. This position can be fixed by controlling the size and shape of the reaction tube, the supply rate of the non-oxidizing gas, the heating temperature, and the like.

Figure 3:
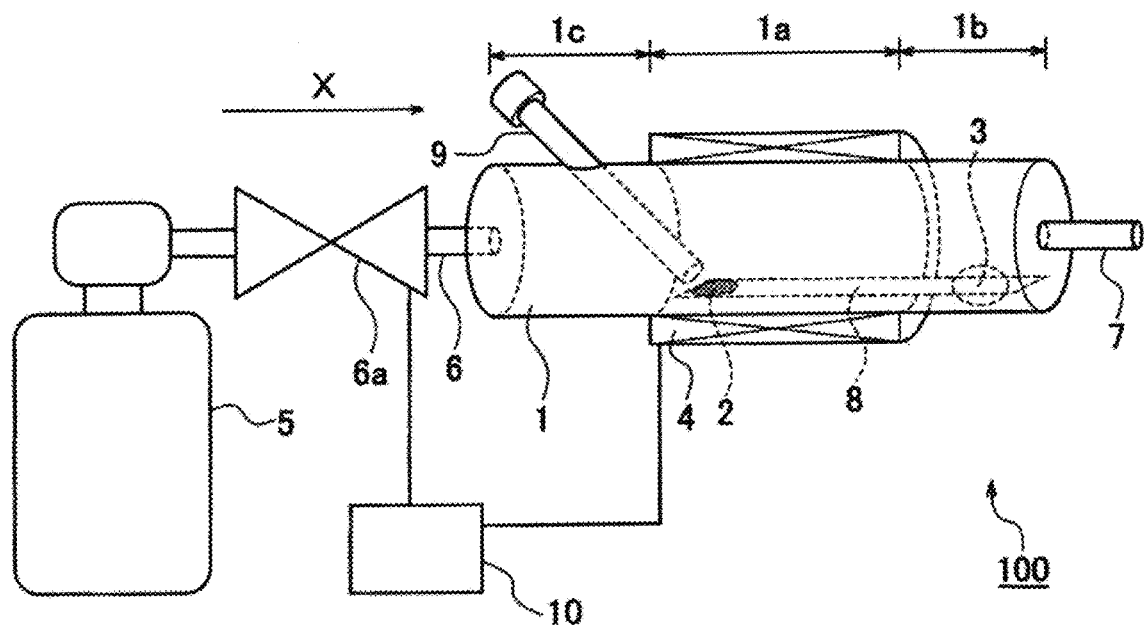
FIG. 3 is a schematic perspective view for explaining another example of an apparatus for manufacturing a fullerene structure.

FIG. 3 shows another example of an apparatus for manufacturing a fullerene structure according to one embodiment. In FIG. 3, members common to those in FIG. 2 are denoted by the same reference numerals as those in FIG. 2, and parts not specifically described are the same as those in FIG. 2.

In FIG. 3, an apparatus 100 for manufacturing a fullerene structure includes a raw material charging tube 9.

The raw material charging tube 9 has a heat-resistant tubular structure, and is inserted through the reaction tube 1 in the non-heating region 1c such that an opening is positioned near the raw material charging part 2 in the reaction tube 1. This enables charging of the fullerene raw material to the raw material charging part 2 in the reaction tube 1 from the outside of the reaction tube 1. By using this apparatus, the reaction can be performed by keeping the atmosphere in the reaction tube 1 constant while continuing the heating by the heater 4 and continuously charging raw material.

A lid may be provided on an opening of the raw material charging tube 9 through which the raw material is charged. When the raw material is not charged from the raw material charging tube 9, the opening of the raw material charging tube 9 is covered with the lid. Accordingly, the atmosphere and temperature in the reaction tube 1 can be kept more uniform.

The fullerene structure according to the embodiment can be applied to the battery field, the organic electronics field, and the like as a carbon material. Specifically, the fullerene structure can be applied to an organic transistor, an electrode material for a fuel cell, an electrode material for an organic solar cell, a catalyst carrying material, an n-type carbon material, and the like.

EXAMPLES

Hereinafter, the present invention will be described in detail with reference to examples, but the present invention is not limited thereto.

Manufacturing Example 1

A fullerene structure was prepared from a fullerene raw material based on the following procedure.

Fullerene-$C_{60}$ (manufactured by Sigma-Aldrich, 98%) was used as the fullerene raw material.

A cylindrical compact uniform temperature heat treatment device was used as a heating device. FIG. 2 shows a schematic diagram of the device. In the experiment, two silicon substrates were installed on the fullerene raw material charging part 2 and the product collection part 3 which are positioned on the sample table 8 separately.

First, a fullerene raw material was placed on a silicon (Si) substrate, the resultant substrate was placed in the reaction tube 1, and the substrate was adjusted such that the substrate portion on which the fullerene raw material was placed was positioned in the heating region 1a. A silicon substrate for collection was arranged in the non-heating region 1b in the reaction tube 1, Next, an argon gas was supplied from one end side of the reaction tube 1 at 0.5 L per minute and discharged from the other end side so that the inside of the reaction tube 1 was filled with the argon gas. Next, the heating region 1a of the reaction tube 1 was heated by means of the coil heater 4 while the argon gas was supplied at 0.5 L per minute.

The heating was performed at a temperature increase rate of 20 to 30° C./min. After the temperature reached the heating temperature, the temperature was held for 1 hour and then natural cooling in air was performed. After performing cooling until the temperature became 300° C. or less, the supply of the argon was stopped. The heating temperatures are as shown in Table 1.

By heating the heating region 1a of the reaction tube 1, the fullerene raw material is sublimated. The atmosphere including the fullerene raw material is carried to the non-heating region 1b at the downstream side by means of the argon gas. A fullerene crystal is precipitated at a fixed place and the fullerene crystal is deposited on the silicon substrate for collection.

The reaction tube had an inner diameter of φ36 mm, an axial long diameter of 500 mm, and was made of quartz glass.

The silicon substrate (fullerene raw material charging part) was 2 mm×2 mm.

The silicon substrate (product collection part) was 1 mm 3 mm.

The dose of the fullerene raw material was 0.1 to 0.3 g.

The formation amount of fullerene crystals relative to the supply amount of fullerene raw material was observed. The precipitation of fullerene crystals was evaluated according to the following criteria. The results are shown in Table 1.

A: The formation of fullerene crystals was observed.

B: The formation of fullerene crystals was observed, but the formation amount of fullerene crystals was smaller than that of A.

C: The formation of fullerene crystals was not observed.

TABLE 1

|  | Heating temperature (° C.) | Precipitation of fullerene crystal |
|---|---|---|
| Example 1 | 900 | A |
| Example 2 | 800 | A |
| Example 3 | 700 | B |
| Example 4 | 650 | C |

As shown in the table, it was possible to observe the formation of fullerene crystals by controlling the heating temperature to 700° C. or higher in case of $C_{60}$ fullerene.

In heating at 800° C. or higher, the amount of sublimation of the fullerene raw material was large, and a large amount of fullerene crystals was precipitated in a cooling part of the non-heating region 1b.

In heating at 700° C., the amount of sublimation of the fullerene raw material slightly decreased, and the formation amount of fullerene crystals slightly decreased in the cooling part.

At 650° C., almost all of the fullerene raw material remained in the heating region 1a, and the formation of fullerene crystals was not observed in the cooling part.

Figure 4:
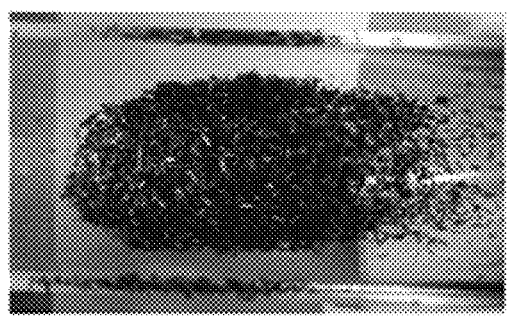
FIG. 4 shows photographs of fullerene structures collected in Examples 1 to 4, and (a) to (d) show photographs of Examples 1 to 4 respectively.
Figure 4:
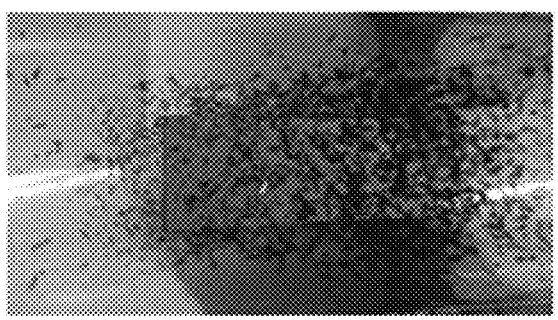
Figure 4:
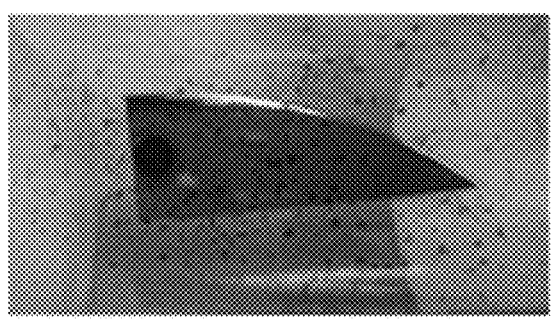
Figure 4:
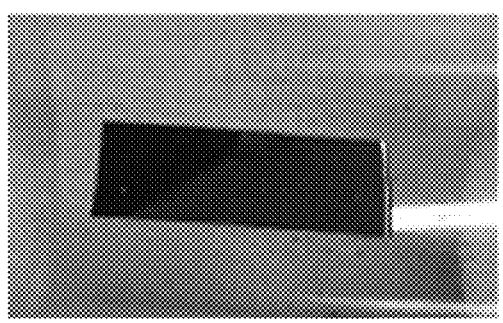

FIG. 4 shows photographs of fullerene crystals deposited on silicon substrates for collection in the non-heating region 1b. In the drawing, (a) to (d) show photographs of Examples 1 to 4, respectively. In the drawing, black portions are silicon substrates. Granular fullerene crystals were observed on the silicon substrates in Examples 1 to 3, and no fullerene crystals were observed in Example 4.

The obtained fullerene structure was observed by using a scanning electron microscope (SEM).

Figure 6:
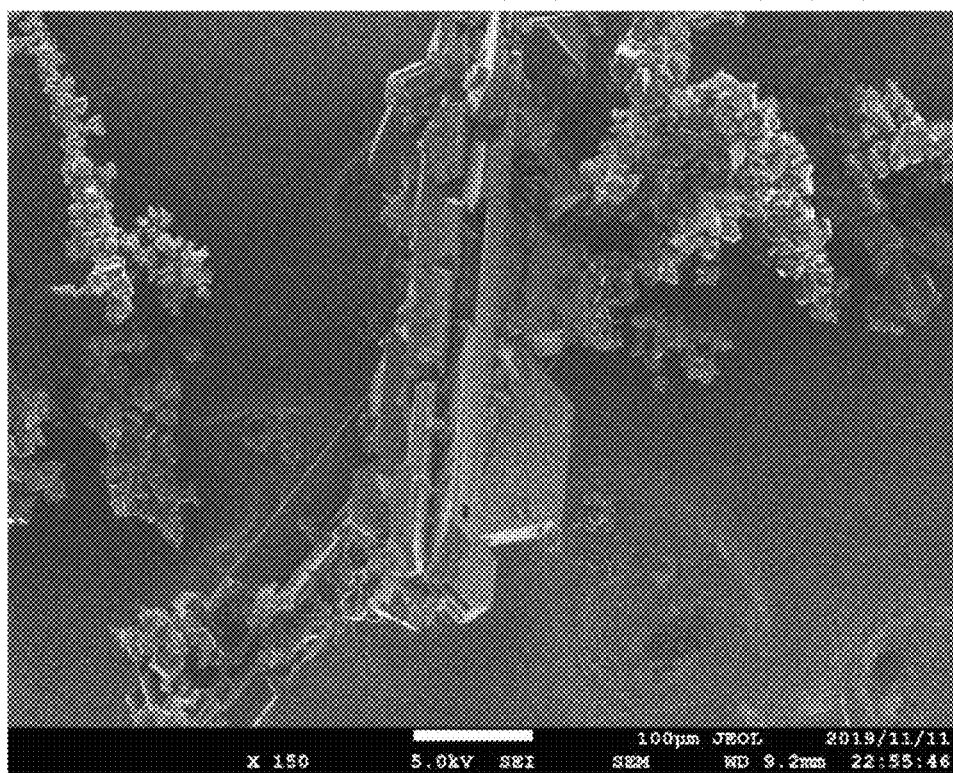
FIG. 6 is a photograph of the fullerene structure obtained in Example 2 by means of a scanning electron microscope (SEM).
Figure 7:
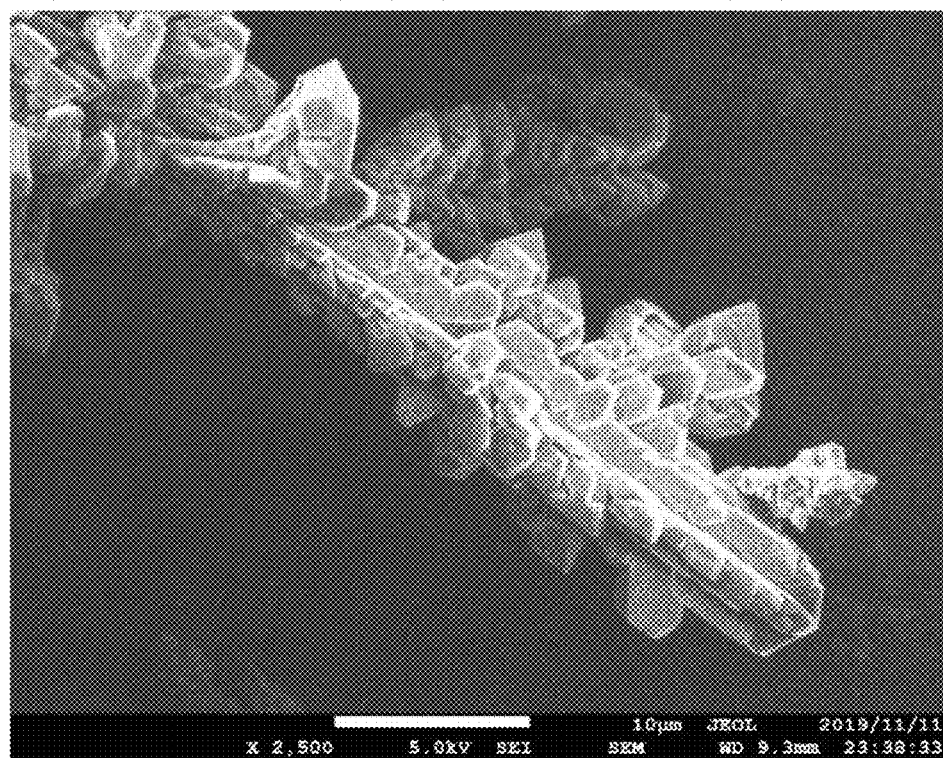
FIG. 7 is a photograph of the fullerene structure obtained in Example 3 by means of a scanning electron microscope (SEM).

FIG. 5 shows an SEM photograph image of Example 1, FIG. 6 shows an SEM photograph image of Example 2, and FIG. 7 shows an SEM photograph image of Example 3. In the SEM photograph images, in FIGS. 5 and 6, the white lines at the bottom of the photographs show a 100-μm scale bar, and in FIG. 7, the white line at the bottom of the photograph shows a 10-μm scale bar.

From these drawings, it was confirmed that each of the fullerene structures of Examples 1 to 3 had a column-shaped part having a fin part. In Example 1 in which a higher temperature treatment was performed, the crystallinity was good, and a clear column-shaped part and a large fin part were observed. This is because, in the high temperature heating, energetically stable plane directions were preferentially formed, the number of plane directions decreased, and the fin part grew to be large. In Example 2, some irregular structures were observed. In Example 3, it was confirmed that the shape of a fin part formed on a column-shaped part was small and that the fin part had various plane directions. This is because the crystallinity decreased due to the low temperature treatment.

Figure 8:
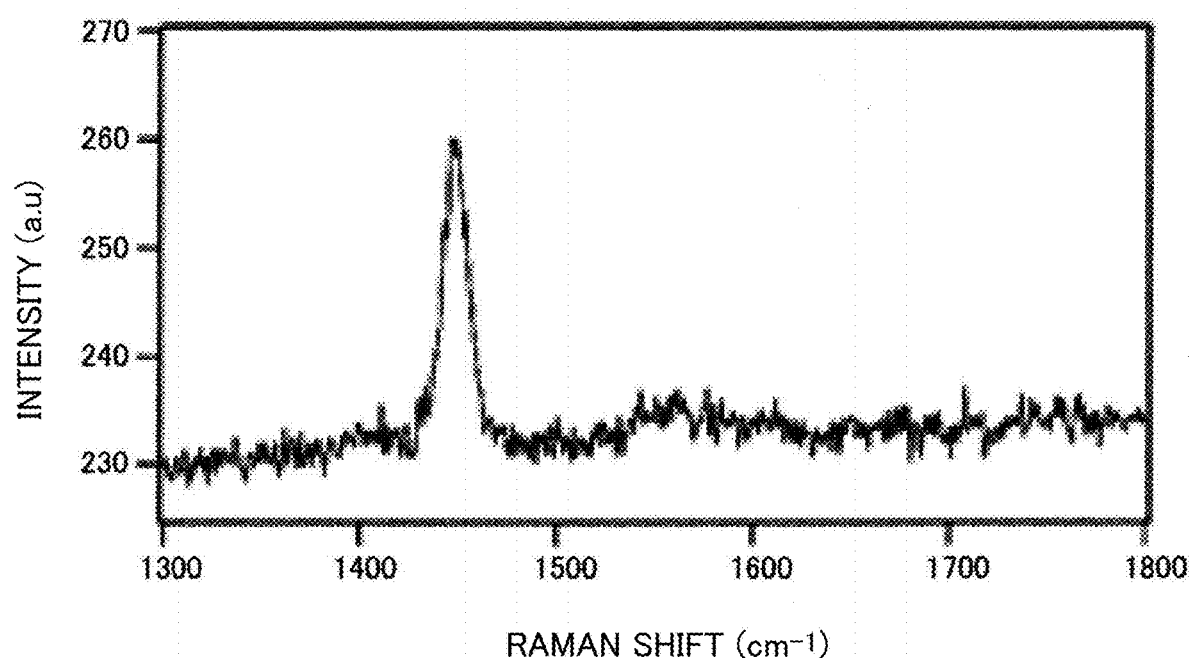
FIG. 8 shows the result of measuring Raman spectrum of the fullerene structure obtained in Example 1.

FIG. 8 shows the result of measuring the Raman spectrum of the fullerene structure obtained in Example 1, From this drawing, it was confirmed that the fullerene structure of Example 1 was $C_{60}$ fullerene from the peak position of the Raman spectrum.

Figure 9:
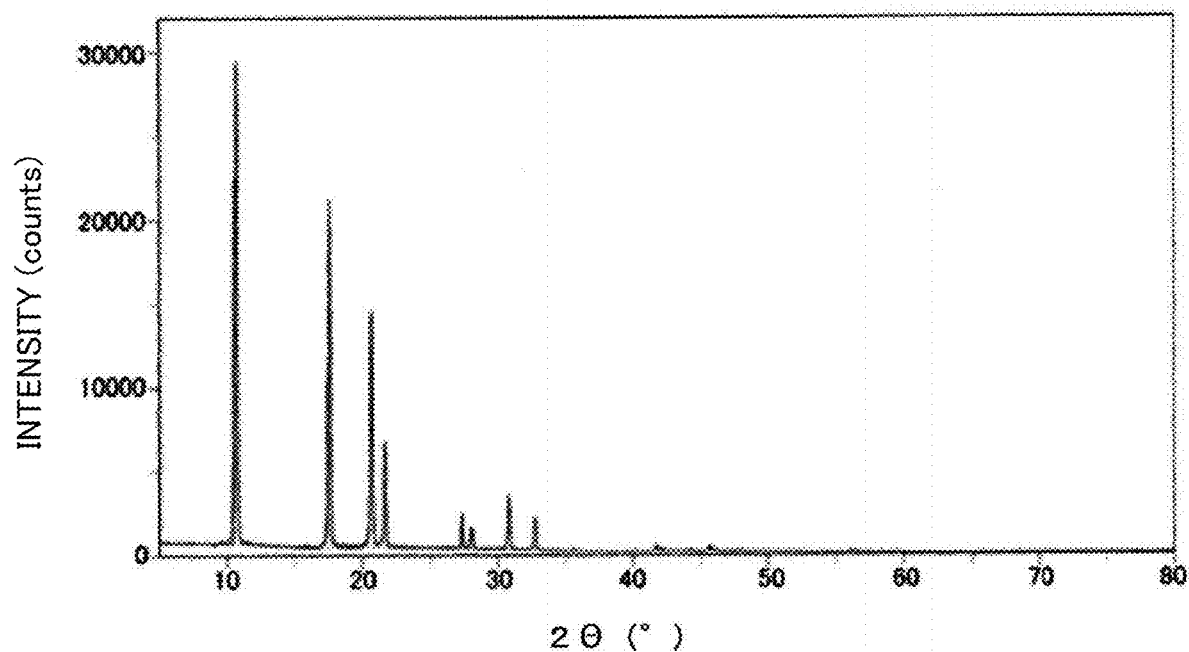
FIG. 9 shows the result of measuring an XRD spectrum of the fullerene structure obtained in Example 1.

FIG. 9 shows the result of measuring the XRD spectrum of the fullerene structure obtained in Example 1.

From this drawing, it was confirmed that the fullerene structure of Example 1 was a face-centered cubic lattice (fcc), It is considered that the planar part of a fin part formed on a column-shaped part becomes large in the SEM photograph image shown in FIG. 5 because the fullerene structure of Example 1 exhibits a clear face-centered cubic lattice.

Manufacturing Example 2

A fullerene structure of Example 5 was prepared according to the same procedure as in Example 1 of the above Manufacturing Example 1 except that the heating time was changed to 10 minutes.

Figure 10:
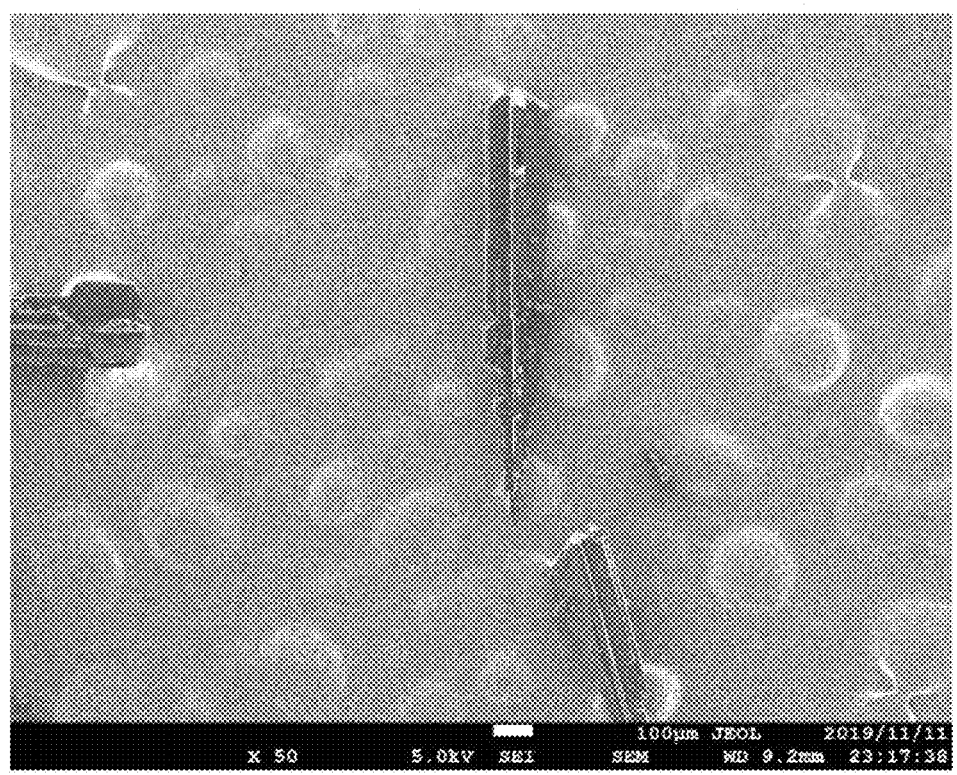
FIG. 10 is a photograph of the fullerene structure obtained in Example 5 by means of a scanning electron microscope (SEM).

FIG. 10 shows the result of observing the obtained fullerene structure by using a scanning electron microscope (SEM). In the SEM photograph image, the white line at the bottom of the photograph shows a 100-μm scale bar.

From this drawing, the formation of a columnar crystal having a fin part was observed even if the heating time was as short as 10 minutes. Comparing the SEM photograph images of Examples 1 and 5, it can be confirmed that, if the heating time is as long as one hour, the crystal growth advances more and the shape of the fin part formed on the columnar crystal becomes larger.

It is to be noted that, besides those already mentioned above, many modifications and variations of the above embodiments may be made without departing from the novel and advantageous features of the present invention. Accordingly, all such modifications and variations are intended to be included within the scope of the appended claims.

REFERENCE SIGNS LIST (1) Reaction tube, (2) Raw material charging part, (3) Product collection part, (4) Heater, (5) Gas supplier, (6) Gas supply pipe, (7) Gas discharge pipe, (8) Sample table, (9) Raw material charging tube, (10) Controller, (100) Apparatus, (31) Reaction tube, (32) Raw material charging part, (33) Product collection part, (34) Heater, (38) Sample table

The invention claimed is:

1. A fullerene structure comprising:
a column-shaped part; and
a fin part projecting from the column-shaped part, wherein
both of the column-shaped part and the fin part are fullerenes,
wherein the fullerene structure comprises sublimable fullerenes, and
wherein the fin part is formed over an entire length of a long diameter of the column-shaped part.

2. The fullerene structure according to claim 1, wherein the fin part is formed on at least one side surface of the column-shaped part.

3. The fullerene structure according to claim 1, wherein both of the column-shaped part and the fin part are crystalline fullerenes.

4. The fullerene structure according to claim 1, wherein the fullerene structure is a microscale fullerene structure.

5. The fullerene structure according to claim 1, wherein the fullerene structure is a millimeter-scale fullerene structure.

6. The fullerene structure according to claim 1, wherein the fullerene structure has a short diameter of 1 µm or more.

7. The fullerene structure according to claim 6, wherein the fullerene structure has a short diameter of 50 µm or more.

8. The fullerene structure according to claim 1, wherein the fullerene structure is a crystalline fullerene having a face-centered cubic lattice.

9. A method of manufacturing the fullerene structure according to claim 1, the method comprising:
heating a fullerene raw material to a sublimable temperature or higher under a non-oxidizing gas; and
cooling an atmosphere in which the fullerene raw material is heated, wherein
the cooling is performed by cooling the atmosphere including the fullerene raw material to a temperature or lower at which a nucleus of a fullerene crystal starts to precipitate, and the cooling is performed by natural cooling in air, or by forced cooling by using a cooler.

10. The method of manufacturing the fullerene structure according to claim 9, wherein
the cooling is performed by natural cooling in air.

11. The method of manufacturing the fullerene structure according to claim 9, wherein
the cooling is performed by forced cooling by using a cooler.

12. The method of manufacturing the fullerene structure according to claim 9, further comprising:
supplying the non-oxidizing gas in one direction;
heating the fullerene raw material to the sublimable temperature or higher at an upstream side of a supply direction of the non-oxidizing gas; and
cooling the atmosphere in which the fullerene raw material is heated at a downstream side of the supply direction of the non-oxidizing gas.

13. The method of manufacturing the fullerene structure according to claim 9, wherein
the fullerene raw material is heated to 800° C. or higher.

14. The method of manufacturing the fullerene structure according to claim 13, wherein
the fullerene raw material is heated to 900° C. or higher.

15. The method of manufacturing the fullerene structure according to claim 9, wherein
a heating time of the fullerene raw material is 10 hours or less.

16. A method of manufacturing the microscale fullerene structure according to claim 4, comprising:
heating a fullerene raw material to a sublimable temperature or higher under a non-oxidizing gas; and
cooling an atmosphere in which the fullerene raw material is heated, wherein
the heating and the cooling are performed by supplying the non-oxidizing gas in one direction, heating the fullerene raw material to the sublimable temperature or higher at an upstream side of a supply direction of the non-oxidizing gas, and cooling the atmosphere in which the fullerene raw material is heated at a downstream side of the supply direction of the non-oxidizing gas, and
the cooling is performed by natural cooling in air and by cooling the atmosphere including the fullerene raw material to a temperature or lower at which a nucleus of a fullerene crystal starts to precipitate.

17. The fullerene structure according to claim 1, wherein the fullerene structure has a short diameter of 10 µm or more.

18. The fullerene structure according to claim 1, wherein the fin part projects from a side surface of the columnar shape by a length of 0.5 times or more of a short diameter of a cross section of the column-shaped part of a portion from which the fin part projects.

19. The fullerene structure according to claim 1, wherein the fullerene structure has a short diameter of 10 µm or more, and wherein
the fin part projects from a side surface of the columnar shape by a length of 0.5 times or more of a short diameter of a cross section of the column-shaped part of a portion from which the fin part projects.

* * * * *